(12) United States Patent
Kasper et al.

(10) Patent No.: US 10,225,920 B2
(45) Date of Patent: Mar. 5, 2019

(54) PRINTED CIRCUIT BOARD STRUCTURE

(71) Applicant: AT&S Austria Technologie & Systemtechnik Aktiengesellschaft, Leoben (AT)

(72) Inventors: Alexander Kasper, Graz (AT); Gernot Schulz, Graz (AT); Ravi Hanyal Shivarudrappa, Spielberg (AT); Markus Maier, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/034,829

(22) PCT Filed: Oct. 9, 2014

(86) PCT No.: PCT/AT2014/050238
§ 371 (c)(1),
(2) Date: May 5, 2016

(87) PCT Pub. No.: WO2015/066742
PCT Pub. Date: May 14, 2015

(65) Prior Publication Data
US 2016/0278199 A1    Sep. 22, 2016

(30) Foreign Application Priority Data

Nov. 7, 2013   (AT) .................................. A 857/2013
Mar. 5, 2014   (AT) .............................. A 50163/2014

(51) Int. Cl.
*H05K 1/02*      (2006.01)
*H05K 1/11*      (2006.01)
*H05K 3/46*      (2006.01)

(52) U.S. Cl.
CPC ......... *H05K 1/0204* (2013.01); *H05K 1/0203* (2013.01); *H05K 1/0298* (2013.01);
(Continued)

(58) Field of Classification Search
CPC .... H05K 1/0204; H05K 1/115; H05K 1/0298; H05K 1/0203; H05K 2201/0187;
(Continued)

(56) References Cited

U.S. PATENT DOCUMENTS 4,021,631 A * 5/1977 Sprando ................. H01H 50/16
                                                           200/238
4,229,805 A * 10/1980 Breed ................. G11C 19/0841
                                                           365/19

(Continued)

FOREIGN PATENT DOCUMENTS

AT          511758 A2    2/2013
CN       201349384 Y    11/2009
(Continued)

OTHER PUBLICATIONS

Office Action dated Aug. 29, 2014 of the corresponding Austrian priority patent application No. A 857/2013.
(Continued)

*Primary Examiner* — Ishwarbhai B Patel
(74) *Attorney, Agent, or Firm* — KPPB LLP

(57) ABSTRACT

The invention relates to a printed circuit board structure with at least one dielectric insulating layer and at least one conductive layer, in which within the at least one insulating layer, a layer made of a dielectric thermally conductive material is provided that is located at least in the vicinity of, or in contact with, an inner conductor arrangement. Another thermally conductive layer, preferably an electrically conductive metal layer, can be provided in the immediate vicinity of, or in contact with, the layer made of a dielectric
(Continued)

thermally conductive material. It is also possible for an at least thermally conductive, preferably electrically conductive feedthrough to pass from a conductor section lying on the outside of the printed circuit board into the inside of the printed circuit board, at least into the vicinity of the layer made of a dielectric thermally conductive material.

10 Claims, 10 Drawing Sheets

(52) U.S. Cl.
CPC ........... *H05K 1/115* (2013.01); *H05K 1/0207* (2013.01); *H05K 1/0263* (2013.01); *H05K 3/4688* (2013.01); *H05K 2201/0187* (2013.01); *H05K 2201/026* (2013.01); *H05K 2201/0209* (2013.01); *H05K 2201/0323* (2013.01)

(58) Field of Classification Search
CPC ........... H05K 1/0207; H05K 2201/026; H05K 2201/0323; H05K 3/4688; H05K 1/0263; H05K 2201/0209
See application file for complete search history.

(56) References Cited

U.S. PATENT DOCUMENTS

| | | | | |
|---|---|---|---|---|
| H1471 H | * | 8/1995 | Braun | H05K 1/056 361/688 |
| 5,672,414 A | * | 9/1997 | Okamoto | H01L 23/24 257/E23.14 |
| 6,528,145 B1 | * | 3/2003 | Berger | H01L 21/4857 174/256 |
| 6,744,135 B2 | * | 6/2004 | Hasebe | H01L 23/142 257/707 |
| 7,462,784 B2 | * | 12/2008 | Kariya | H01L 21/4857 174/260 |
| 8,811,019 B2 | * | 8/2014 | Gottwald | H01L 23/5389 174/252 |
| 8,895,863 B2 | * | 11/2014 | Inaba | H05K 1/0201 174/252 |
| 2004/0108937 A1 | * | 6/2004 | Ernsberger | H01C 1/028 338/309 |
| 2008/0304237 A1 | | 12/2008 | Shiraishi et al. | |
| 2009/0091020 A1 | | 4/2009 | Wei et al. | |
| 2009/0242248 A1 | | 10/2009 | Sohn et al. | |
| 2012/0031652 A1 | | 2/2012 | Tseng et al. | |
| 2012/0056193 A1 | * | 3/2012 | Lester | H01L 27/153 257/76 |

FOREIGN PATENT DOCUMENTS

| | | |
|---|---|---|
| CN | 203057688 U | 7/2013 |
| DE | 19756818 A1 | 6/1999 |
| DE | 102004019431 A1 | 11/2005 |
| EP | 0591887 A2 | 4/1994 |
| EP | 1722612 A1 | 11/2006 |
| JP | H0774444 A | 3/1995 |
| JP | 11238954 A | 8/1999 |
| WO | WO2015066742 | 3/2015 |

OTHER PUBLICATIONS

Office Action dated Dec. 3, 2014 of the corresponding Austrian priority patent application No. A 50163/2014.
International Search Report for International Application No. PCT/AT2014/050238, Search completed Jan. 29, 2015, dated Feb. 6, 2015, 3 Pgs.
International Preliminary Report on Patentability for International Application No. PCT/AT2014/050238, dated Sep. 4, 2015, dated Mar. 16, 2016, 11 Pgs.

* cited by examiner

PRINTED CIRCUIT BOARD STRUCTURE

This application is a national stage of Application No. PCT/AT2014/050238, filed Oct. 9, 2014, which application claims priority to Austrian Application No. A50163/2014, filed Mar. 5, 2014, and Austrian Application No. A857/2013, filed Nov. 7, 2013, the disclosures of which are hereby incorporated by reference in their entireties.

The invention relates to a printed circuit board structure with at least one dielectric insulating layer and at least one conductive layer.

The distribution of the heat that is produced in a printed circuit board and the cooling of its components, in short its thermal management, is a problem that is becoming more and more important. Because the surfaces of a printed circuit board must hold an ever larger number of components, especially ICs, and because these components develop more and more heat, for example due to high functional integration within the chip, the functionality of the components, e.g., the ICs, must continue to be ensured, despite the heat that is produced, to prevent customers from having problems involving, for example, mobile telephones becoming very hot against the user's ear. It is known in the art to transport the heat that is produced, where possible, away through so-called thermal vias to heat sinks, i.e., elements located on the surface of the printed circuit board, which can then be actively or passively cooled using, e.g., a fan.

However, the production of such thermal vias is costly and time-consuming, and such thermal vias often cannot be created in the immediate vicinity of the heat source, which reduces their effect.

Accordingly, it is a goal of the invention to create a printed circuit board structure that offers better thermal management and that is cheaper to manufacture.

This is accomplished in an inventive printed circuit board structure that has, within the at least one insulating layer, a layer made of a dielectric thermally conductive material that is located at least in the vicinity of, or in contact with, an inner conductor track structure.

The invention allows inexpensive production of printed circuit boards which are intended to conduct the heat away from strongly heated areas, or distribute it, and moreover the appearance of the printed circuit board is unchanged, i.e., its dimensions, in particular its thickness, can remain the same. Moreover, the printed circuit board structure can be produced using conventional printed circuit board production processes. The invention offers its special advantages in mobile devices such as mobile telephones, mobile computers, in the automobile industry, and in medical and other industrial products.

To improve the distribution and dissipation of heat that is produced, it is possible to provide, in the immediate vicinity of, or in contact with, the layer made of a dielectric thermally conductive material, another thermally conductive layer. In most cases, it is preferred for the other thermally conductive layer to be an electrically conductive metal layer.

To dissipate heat into the inside of the structure in an efficient and rapid manner, it can be advantageous to provide an at least thermally conductive feedthrough that passes from a conductor section lying on the outside of the printed circuit board into the inside of the printed circuit board, at least into the vicinity of the layer made of a dielectric thermally conductive material. In this case, it is especially expedient for the thermally conductive feedthrough to be electrically conductive, pass to an inner conductor track, and make electrical contact with the latter.

Another improvement in the thermal management can be achieved if a feedthrough passes from one conductor section to another conductor section lying at a distance from the first one, this feedthrough also running at least in the vicinity of the layer made of a dielectric thermally conductive material. It can also be advantageous for the feedthrough to be connected with an inner conductor track structure. In many cases it is also recommended that the feedthrough pass from an outer conductive layer on one side to an outer conductive layer on the opposite side.

Especially good heat transfer is obtained if the layer made of a dielectric thermally conductive material fills spaces within the inside conductor track structure.

The invention along with other advantages is explained in detail below on the basis of sample embodiments that make reference to the attached drawings. These figures are as follows.

Figure 1:
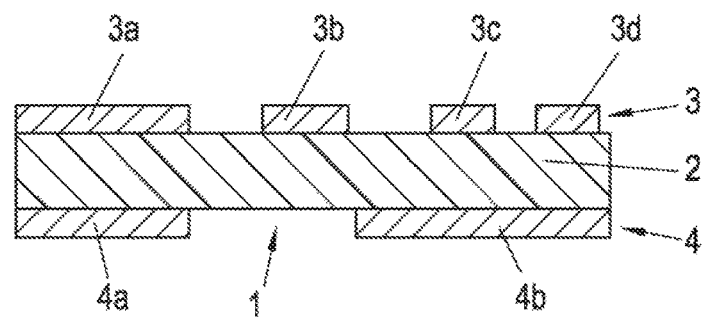
FIG. 1 through 4 are schematic partial sections showing the production and structure of a first embodiment of the invention.

First, the production of a first embodiment of the invention will be described with reference to FIGS. 1 through 4. The starting point, shown in FIG. 1, is a printed circuit board 1 which comprises an insulating layer 2, e.g., a prepreg, and an upper conductor track structure 3 with conductor tracks 3a through 3d drawn in here, and a lower conductor track structure 4 with conductor tracks 4a and 4b drawn in here. The printed circuit board 1 is generally prefabricated, and then already has an etched copper pattern. In a next step shown in FIG. 2, a layer 5 made of a thermally conductive dielectric material is now applied to the upper conductor track structure, the spaces between individual conductor tracks also being filled with this thermally conductive dielectric material 5. Possible thermally conductive materials are, for example, ceramic-filled pastes and carbon nanotubes, it being possible for the application processes to be different.

Preferred processes are printing processes, e.g., screen printing, stencil printing, or other printing processes, but other processes can be used to apply the thermally conductive material. It is also possible to use another process to apply the thermally conductive material over the entire surface. Subsequent structuring can be advantageous if it is not desired that the material cover the entire surface or if the usual printing processes cannot be used to print a design that might be technically elaborate. The thermally conductive material can then be applied over the entire surface using a usual printing process and precured (corresponding to the so-called "B-staging" of epoxy resins, such as FR-4). Then, a structuring can be performed using a photolithographic process that is usual in printed circuit board production, involving, e.g., exposure with film masking or LDI (Laser Direct Imaging). After development and washing with suitable chemicals, the structuring is preserved and the material is completely cured. The curing is done using usual methods, such as, e.g., thermal curing, UV or IR curing, use of laser irradiation, etc.

The layer thicknesses of the thermally conductive materials in particular cases lie in the range from 5 µm to 100 µm, and the thermal conductivities lie between 1 W/m·K and 20 W/m·K, depending on the material.

Figure 2:
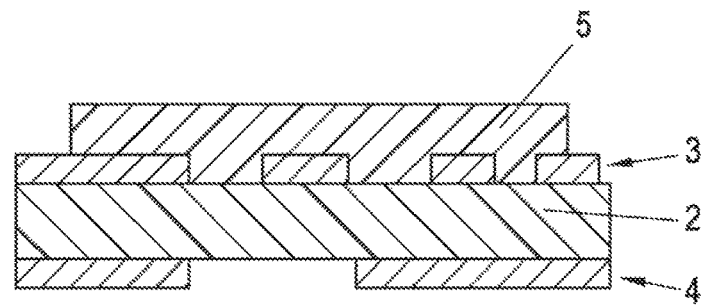
Figure 3:
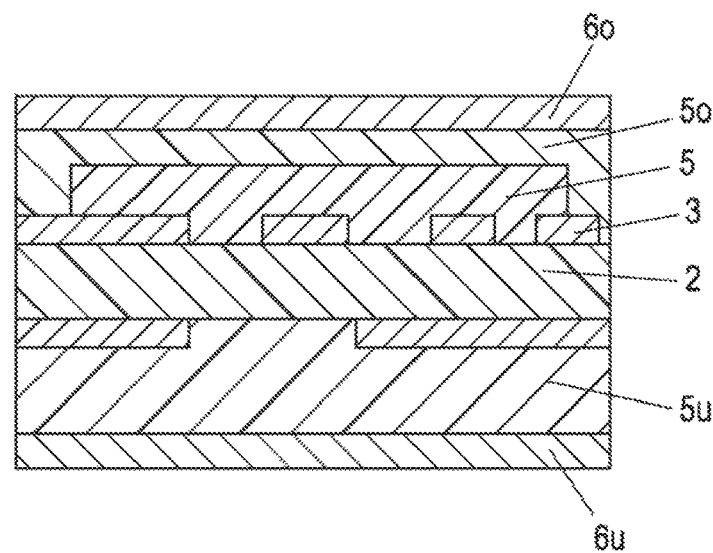
Figure 4:
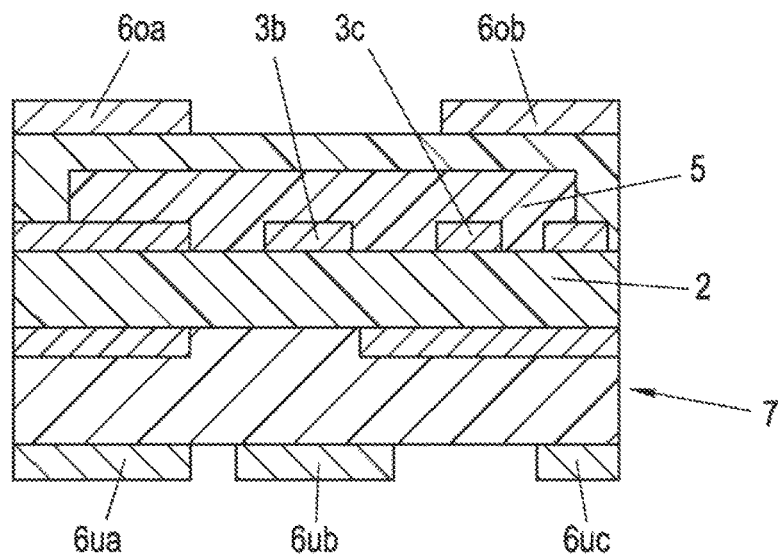

In a next step shown in FIG. 3, the existing structure shown in FIG. 2 is supplemented by other layers of prepregs and copper foils, here namely by an upper layer 5o of a dielectric and a lower layer 5u of a dielectric, these layers 5o and 5u being covered by a copper layer 6o and 6u, e.g., by copper foils. Here it should be noted that the terms "upper" and "lower" only refer to the representations in the drawings and, are used to facilitate description.

In a last step, the upper conductive layer 6o and the lower conductive layer 6u are additionally structured in a desired way to produce individual conductor tracks, which are labeled 6oa, 6ob, and 6ua, 6ub and 6uc in the drawing. The layer 5 made of a thermally conductive material now makes it possible to conduct heat, produced in this case, e.g., by heating of the conductor tracks 3b or 3c, away from these conductor tracks, and distribute it so that there is no excessive heat—so-called "hot spots"—either inside or on the surface of the resulting printed circuit board structure 7.

Figure 5:
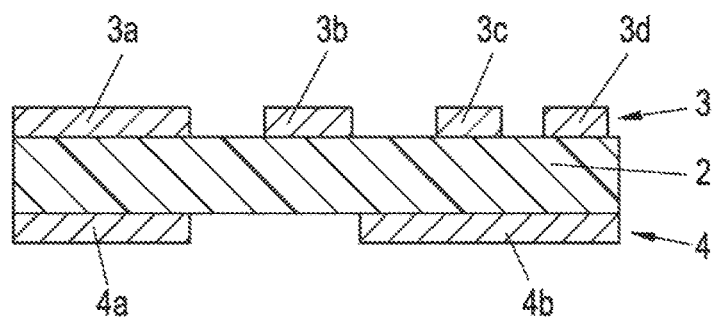
FIG. 5 through 10 are schematic partial sections showing the production and structure of a second embodiment of the invention.
Figure 6:
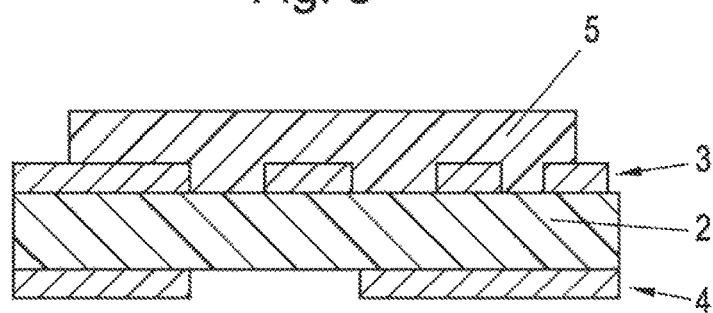
Figure 7:
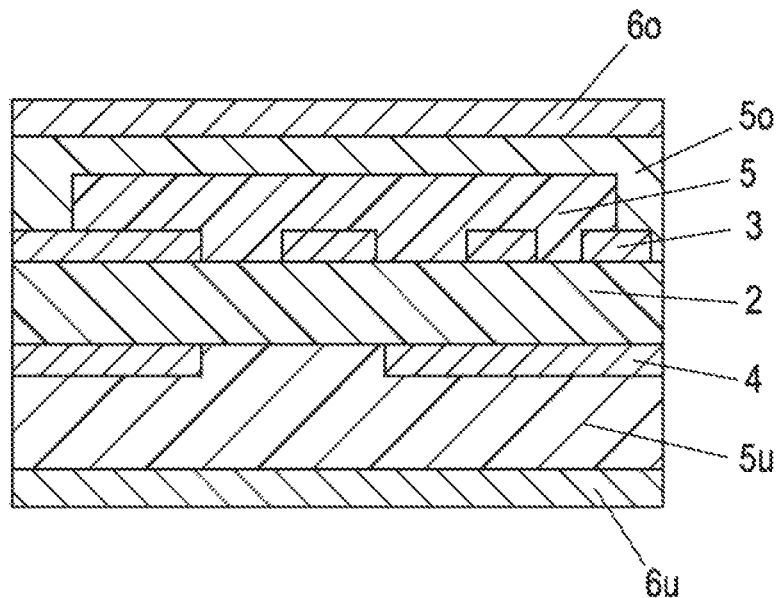
Figure 8:
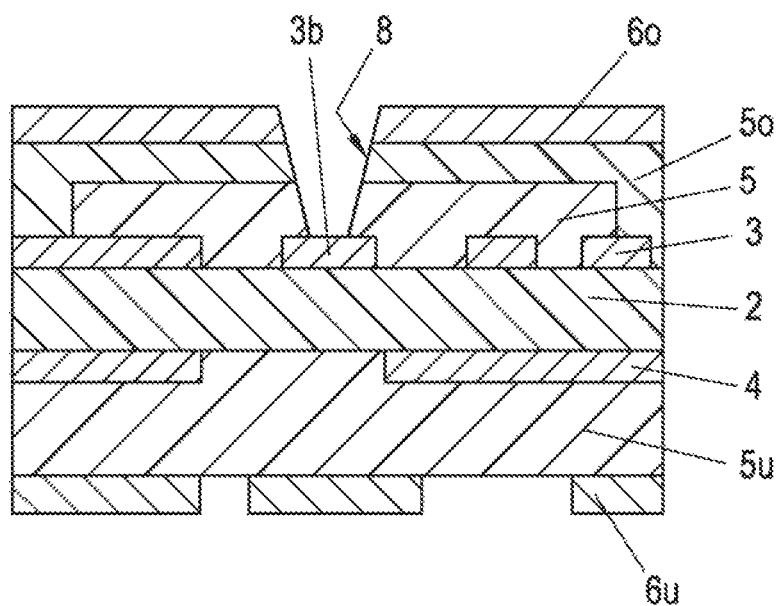
Figure 9:
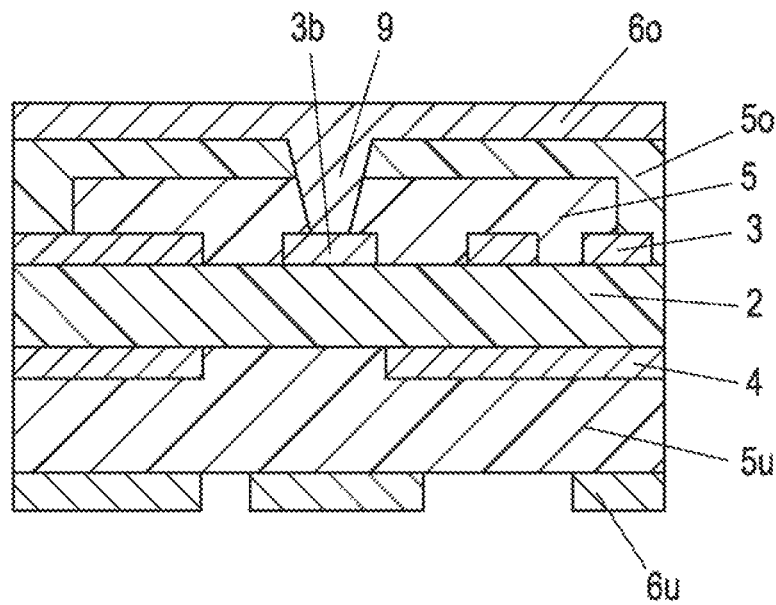

A variant of the invention will now be explained on the basis of FIGS. 5 through 10, the same reference numbers being used for comparable parts, and FIG. 5 through 7 corresponding to FIG. 1 through 3, since the production process up to this point is the same as the one previously described. Starting from the structure shown in FIG. 7, a laser drill hole 8 is now made from the top down to conductor track 3b using a process that is known in printed circuit board production. Usually, the upper copper layer 6o is first drilled using one of the laser drilling processes that are usual in the printed circuit board industry, such as standard UV/CO₂ laser, copper direct CO₂ laser, etc. After drill hole 8 is made, copper plating is applied, for example by a galvanic process, creating a via 9 (vertical interconnect access, feedthrough) from the upper copper track 6o to copper track 3b (see FIG. 9). Then, a copper plating process that is also usual in the printed circuit board industry is used to add copper plating to increase the thickness of the copper to what is required for the subsequent structuring process. Instead of producing a via in this way, it is also possible to produce a mechanical feedthrough from the top to the bottom.

Figure 10:
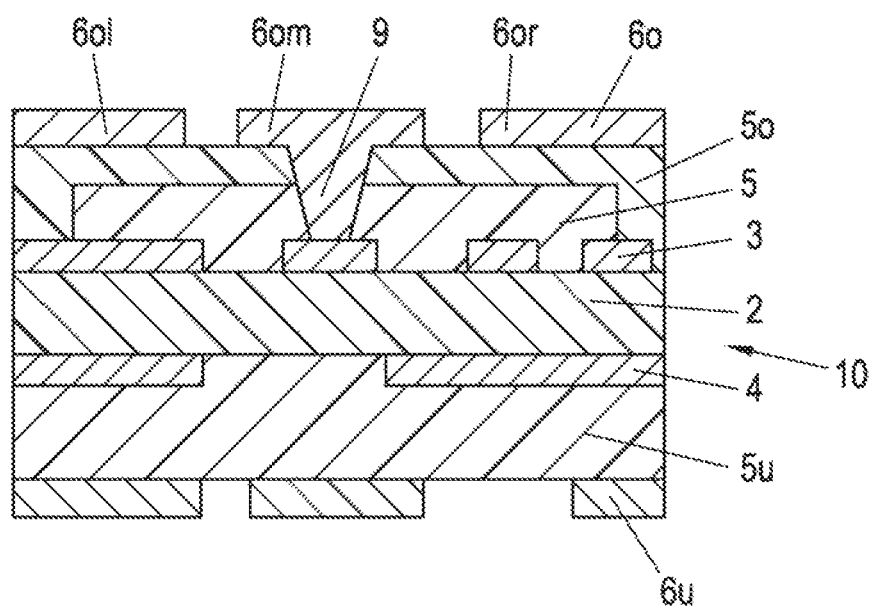

After that, the upper copper track can be structured, resulting in the finished printed circuit board structure 10 shown in FIG. 10. In the embodiment shown here, especially heat that is produced, for example, if a chip with a pad is sitting on this conductor track, can be taken from the upper middle conductor track 6om in FIG. 10, into the inside of the conductor track, where it is distributed by the thermally conductive layer 5, which is in the form of a dielectric, i.e., insulating layer. This avoids excessive heating on the surface of the structure 10.

Figure 11:
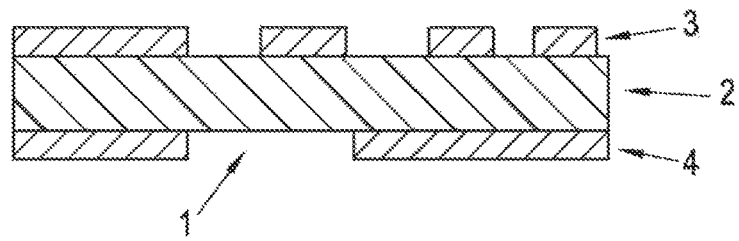
FIG. 11 through 15 are schematic partial sections showing the production and structure of a third embodiment of the invention.
Figure 12:
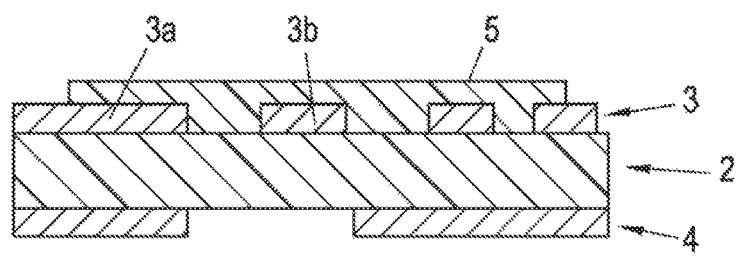
Figure 13:
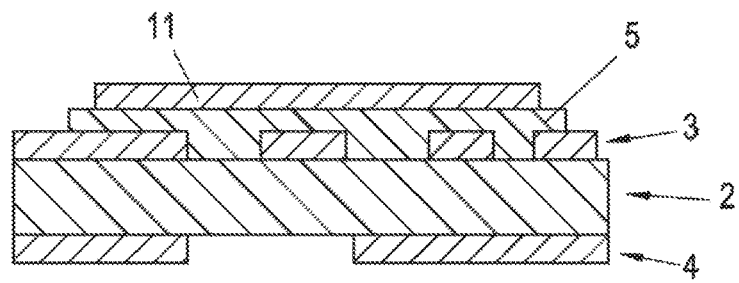
Figure 14:
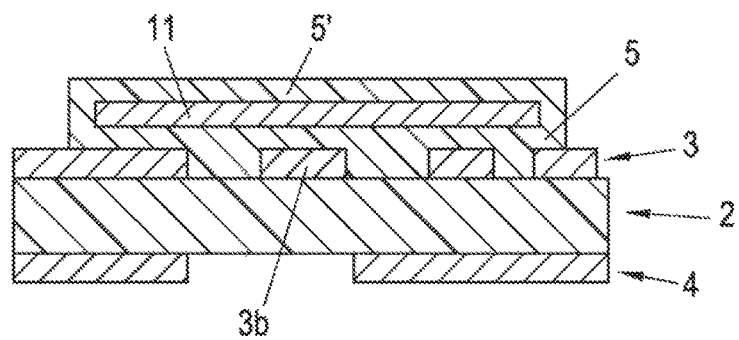

Another variant of an inventive printed circuit board structure will now be described on the basis of FIGS. 11 through 15, and the description will once again use the same reference numbers for the same parts. FIGS. 11 and 12 require no further explanation, since they correspond to FIGS. 1 and 2. Starting from the structure now present in FIG. 12, another thermally conductive layer, especially an electrically conductive metal layer 11, is now applied onto the thermally conductive dielectric layer 5 using a printing process, for example. In a next step, whose result can be seen in FIG. 14, this metal layer 11 is encased by a layer 5' made of thermally conductive dielectric material. Thus, the metal layer 11 is embedded in a thermally conductive dielectric 5, 5'. The layer 11 need not necessarily consist of a pure metal; metal compounds, such as, e.g., aluminum nitride or metal ceramics could also be used.

Figure 15:
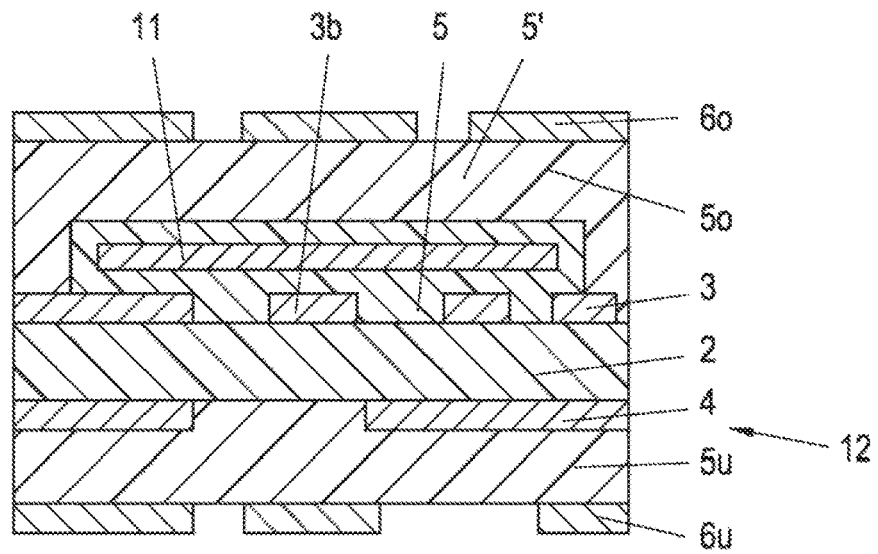
Figure 16:
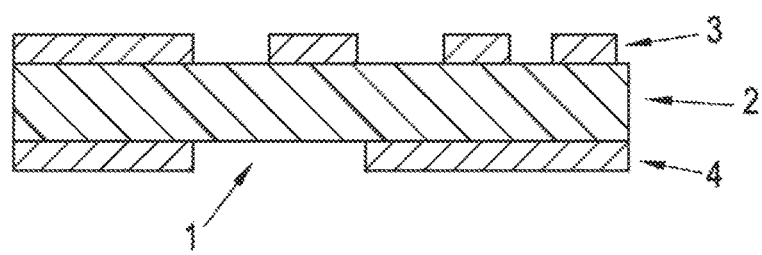
FIG. 16 through 23 are schematic partial sections showing the production and structure of a fourth embodiment of the invention.
Figure 17:
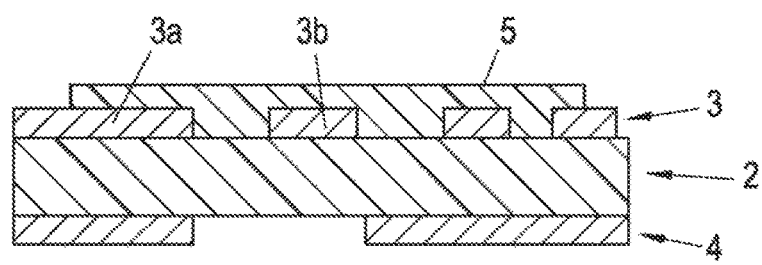
Figure 18:
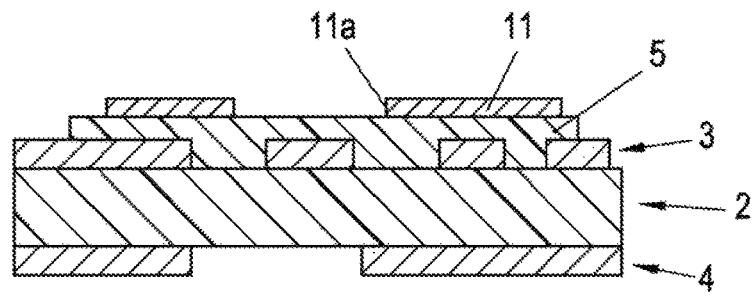

In another step, the thermally conductive dielectric layers 5o and 5u, and conductive layers 6o and 6u, are now applied and structured in a comparable manner to how they were in FIG. 3, resulting in the finished printed circuit board structure 12 shown in FIG. 15. As was already mentioned, such structures can be produced using conventional processes known to the person skilled in the art in the field of printed circuit board production, namely especially pressing of prepreg layers, whose material is selected according to the desired field of application, galvanic deposition of metal layers, and the application of metal layers by printing processes. If the conductive layers 6o and 6u are galvanically deposited, they can then be structured by means of a masking process. In variants of this embodiment, the process can also be carried out to produce a double-sided structure in which the lower layer 5u also has a metal layer embedded in a thermally conductive dielectric, or the second step of printing the thermally conductive dielectric layer can be dropped.

Once again, another embodiment is now explained on the basis of FIG. 16 through FIG. 23. Printed circuit board 1 in FIG. 16 once again corresponds to printed circuit board 1 in FIG. 1 or FIG. 11, and the same analogously goes for the structure shown in FIG. 17, which corresponds to that in FIG. 12, for example. Similarly to the embodiment shown in FIG. 13, this embodiment has a metal layer 11 applied to it, which, however, has an opening 11a here. In a next step, an additional layer 5' made of a dielectric thermally conductive material is applied, e.g., printed, to encase the metal layer 11, comparable with the embodiment shown in FIG. 14.

Figure 19:
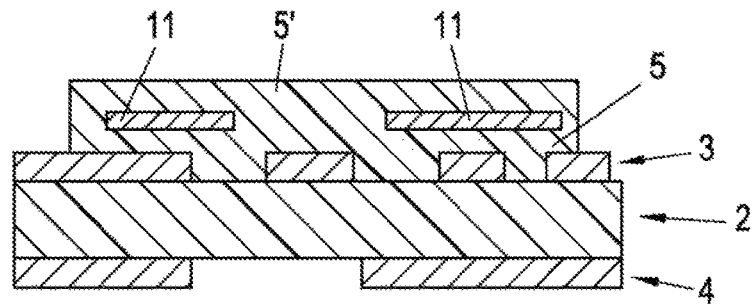
Figure 20:
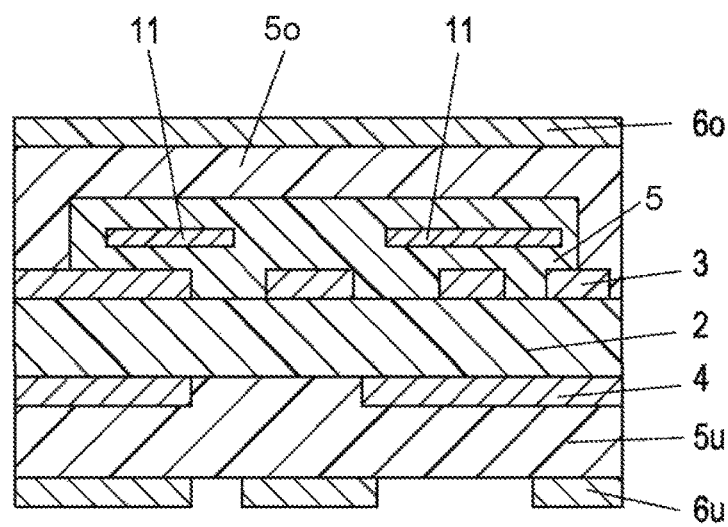
Figure 21:
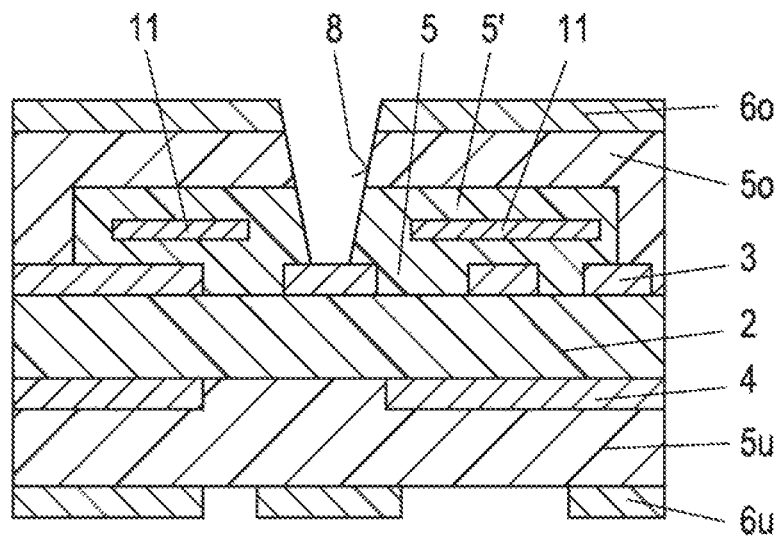
Figure 22:
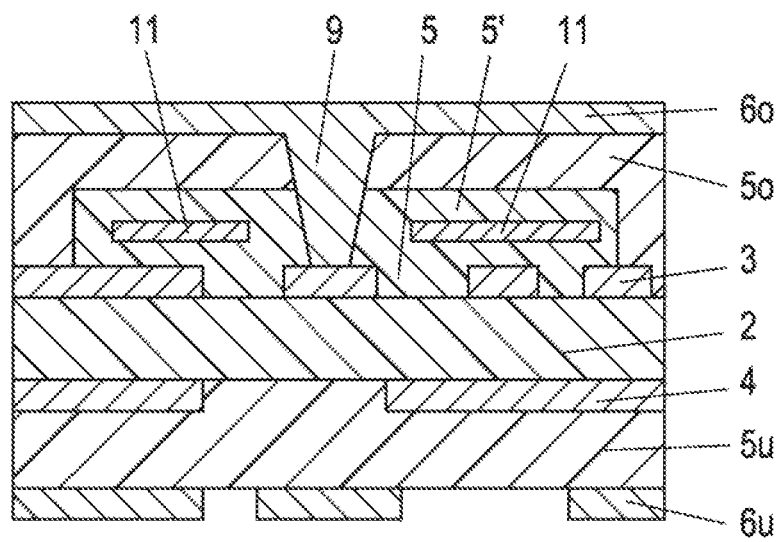
Figure 23:
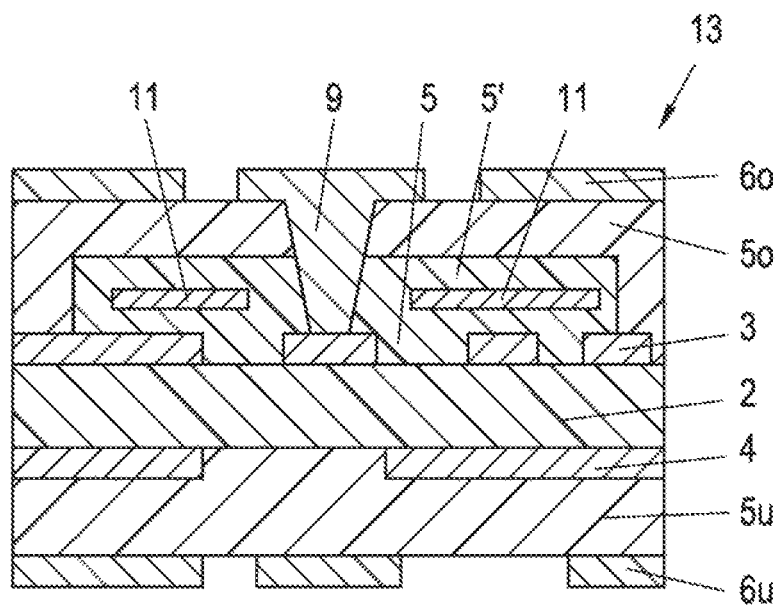

The structure shown in FIG. 19 is now supplemented by pressing with an upper and lower dielectric layer 5o, 5u and conductive layers 6o, 6u, and the result is shown in FIG. 20. Following that, a laser drill hole 8 is made (see FIG. 21 and compare FIG. 8) and, as is shown in FIG. 22, a via 9 is made (compare FIG. 9) by an electroless and galvanic process. After the upper and lower conductive layers 6o and 6u are structured (in this case the lower conductive layer 6u was already structured), the result is the printed circuit board structure 13 shown in FIG. 23, which is characterized by the combination of the dielectric thermally conductive layers 5, 5' with the metal layer 11 and the via 9. Here, for example, heat that is produced in the conductor track 3c, can be managed, i.e., expediently distributed, and likewise heat that is produced in the conductor track 6om, for example by a chip sitting on this conductor track, can be conducted away, namely into the inside of the structure 13. Everything that was said about the production and structuring of the various layers that are used in connection with the examples described above applies in the same way for this and also the following example. In this embodiment as well, the process can be carried out to produce a double-sided structure.

A sample embodiment of the invention is now explained with reference to FIGS. 24 through 26. A layer 15 made of thermally conductive dielectric material is printed onto a thin conductive layer 14, namely a copper foil, it being possible for the layer 15 to be structured or applied over the entire surface and possibly structured later. This printing is done on the so-called treatment side (timer side) of the copper foil. Curing is performed using one of the already mentioned known processes.

Figure 24:
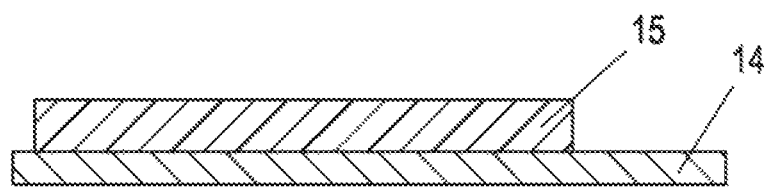
FIG. 24 through 26 are schematic partial sections showing the production and structure of a fifth embodiment of the invention.
Figure 25:
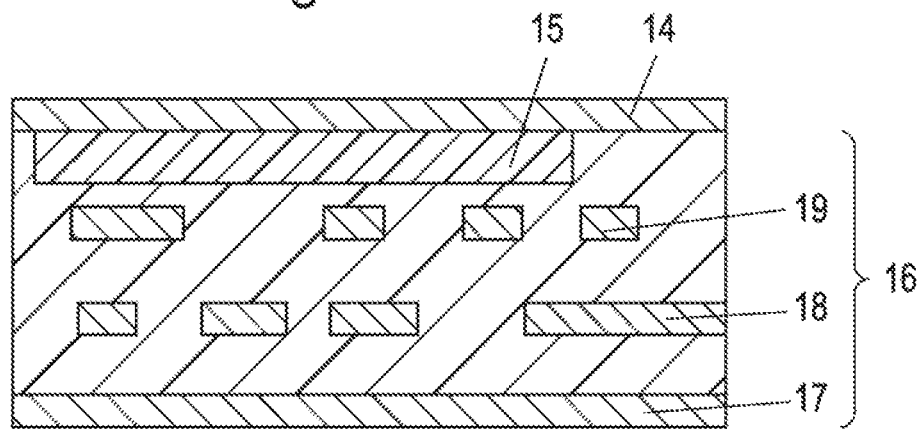

This structure, consisting of the layers 14 and 15, is now connected with a prefabricated and partly structured printed circuit board 16, for example by pressing it in as shown in FIG. 25, the copper foil 14 with the layer 15 now being turned over with respect to the arrangement shown in FIG. 24. The result is a structure shown in FIG. 25, in which the printed circuit board 16 used in this structure has a dielectric, e.g., a prepreg, with a lower conductive layer 17, and two structured conductive layers 18 and 19 on the inside.

Figure 26:
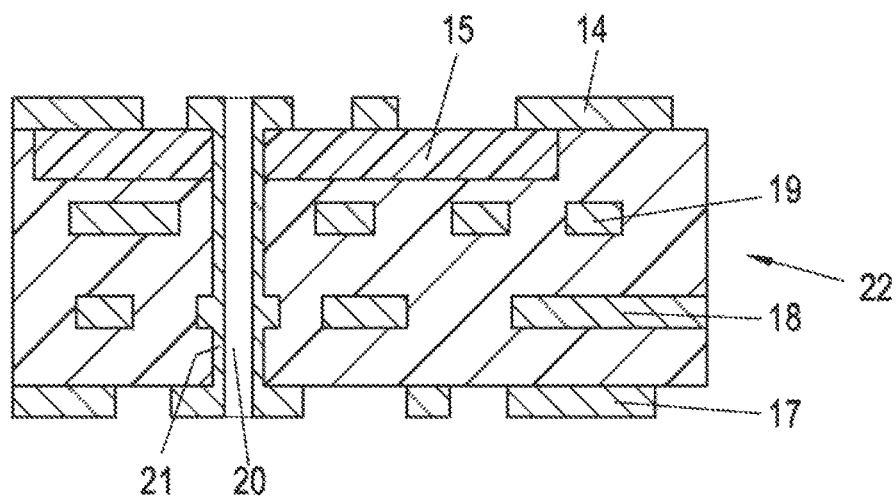

In a following step, whose result is shown in FIG. 26, a drill hole 20 passing through the entire structure is made, for example mechanically or using a laser device. In addition, the conductive layers 14 and 17 are structured. The steps of drilling the hole and structuring can also be reversed. The drill hole 20 now connects a conductor track section of the upper conductive layer 14 with a conductor track section of the lower conductive layer 17, and a copper plating process is used to give it a copper conductive layer 21 inside, which connects the conductor track sections of the conductive layers 14, 18, 17 with one another in an electrically and thermally conductive manner. In this embodiment, heat that is introduced, for example, into a section of the conductive layer 14 at the upper end of the drill hole 20, can be introduced and distributed into the inside of the resulting printed circuit board structure 22.

Figure 27:
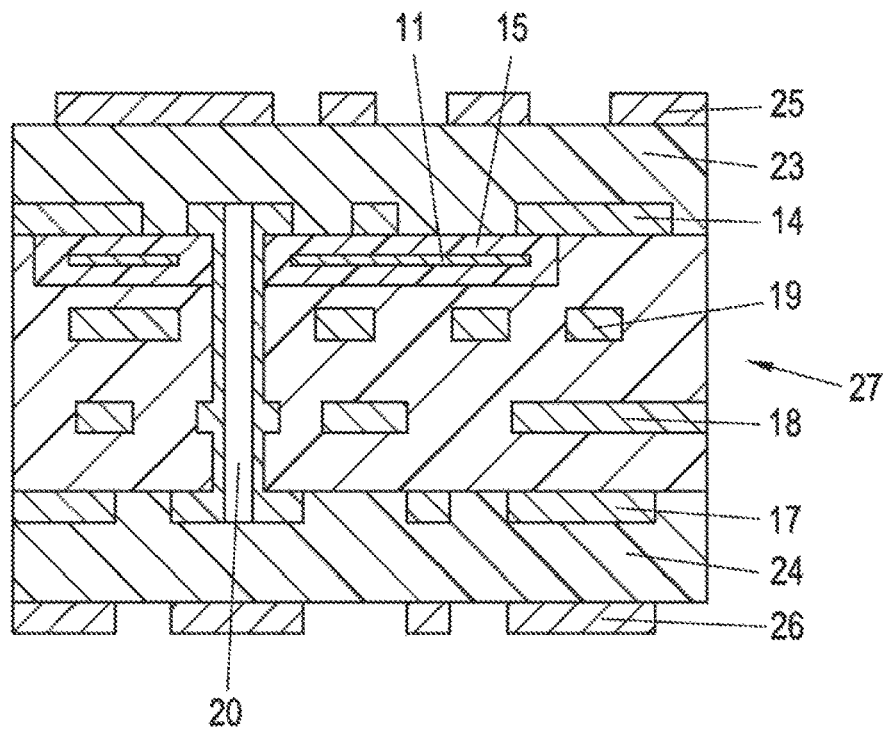
FIG. 27 is a section of a sixth embodiment of the invention, which is a variant of the fifth embodiment shown in FIG. 26.

Finally, FIG. 27 shows a variant, starting from FIG. 26, in which additional dielectric layers 23 and 24 and conductive layers 25 and 26 are also applied onto the structure shown in FIG. 27. Moreover, this printed circuit board structure, labeled with 27, has a metal layer 11, such as, for example, that in FIG. 23, in the layer 15 that is made of thermally conductive dielectric material, which improves heat distribution. In the structure 27, heat can arise either in the area of the drill hole 20 or, for example, on a conductor track of the structured conductive layer 14.

Finally, it should be clear that the portrayals in FIGS. 1 through 27 generally only show details of a larger printed circuit board structure, and in practice various variants can be combined. For example, the variant shown in FIG. 27 could also have a feedthrough 9 in addition to a drill hole 20.

The invention claimed is:

1. A printed circuit board structure comprising:
   at least a first and a second dielectric insulating layers, and
      at least a first conductive layer, wherein the at least first conductive layer is arranged between the at least first and second dielectric insulating layers,
   at least a second and a third conductive layers, wherein the second conductive layer is disposed on the outer surface of the first dielectric insulating layer such that the first dielectric insulating layer is disposed between the first and second conductive layers, and wherein the third conductive layer is disposed on the outer surface of the second dielectric insulating layer such that the second dielectric insulating layer is disposed between the first and third conductive layers;
   an inner conductor track structure formed in the at least first conductive layer;
   a layer of dielectric thermally conductive material embedded within one of the first and second dielectric insulating layers such that all but at least a first surface of the layer of dielectric thermally conductive material is surrounded by one of the first and second insulating layers, and wherein at least the first surface of the layer of dielectric thermally conductive material is disposed in the thermal conductive vicinity of, or in thermal conductive contact with the inner conductor track structure.

2. The printed circuit board structure according to claim 1, further comprising at least one thermally conductive feedthrough that passes from a conductor section lying on the outside of a printed circuit board into the inside of the printed circuit board, at least into the thermal conductive vicinity of the layer of a dielectric thermally conductive material.

3. The printed circuit board structure according to claim 2, wherein the thermally conductive feedthrough is electrically conductive, passes to the inner conductor track, and makes electrical contact with the inner conductor track.

4. The printed circuit board structure according to claim 1, further comprising a feedthrough that passes from a first conductor section to a second conductor section lying at a distance from the first, the feedthrough also running at least in the thermal conductive vicinity of the layer of a dielectric thermally conductive material.

5. The printed circuit board structure according to claim 4, wherein the feedthrough is connected with an inner conductor track structure.

6. The printed circuit board structure according to claim 4, wherein the feedthrough passes from an outer conductive layer on one side of a printed circuit board to an outer conductive layer on the opposite side of the printed circuit board.

7. The printed circuit board structure according to claim 1, wherein the layer of a dielectric thermally conductive material fills spaces within the conductor track structure.

8. The printed circuit board structure according to claim 1, wherein the first surface of the layer of dielectric thermally conductive material is disposed in direct thermal conductive contact with the inner conductor track structure.

9. A printed circuit board structure comprising:
   at least a first and a second dielectric insulating layers, and
      at least a first conductive layer, wherein the at least first conductive layer is arranged between the at least first and second dielectric insulating layers,
   at least a second and a third conductive layers, wherein the second conductive layer is disposed on the outer surface of the first dielectric insulating layer such that the first dielectric insulating layer is disposed between the first and second conductive layers, and wherein the third conductive layer is disposed on the outer surface of the second dielectric insulating layer such that the second dielectric insulating layer is disposed between the first and third conductive layers;
   an inner conductor track structure formed in the at least first conductive layer;
   a layer of dielectric thermally conductive material embedded within one of the first and second dielectric insulating layers such that all but at least a first surface of the layer of dielectric thermally conductive material is surrounded by one of the first and second insulating layers, and wherein at least the first surface of the layer of dielectric thermally conductive material is disposed in the thermal conductive vicinity of, or in thermal conductive contact with the inner conductor track structure; and
   a second thermally conductive layer is provided and embedded and entirely surrounded by the layer of dielectric thermally conductive material.

10. The printed circuit board structure according to claim 9, wherein the second thermally conductive layer is an electrically conductive metal.

\* \* \* \* \*